United States Patent [19]

Vittoz

[11] 4,431,929
[45] Feb. 14, 1984

[54] CMOS DYNAMIC AMPLIFIER

[75] Inventor: Eric A. Vittoz, Cernier, Switzerland

[73] Assignee: Centre Electronique Horloger S.A., Neuchatel, Switzerland

[21] Appl. No.: 355,613

[22] Filed: Mar. 8, 1982

[30] Foreign Application Priority Data

Mar. 26, 1981 [CH] Switzerland .................. 2048/81

[51] Int. Cl.³ .................. G06G 7/18; H03F 3/30
[52] U.S. Cl. .................. 307/490; 330/51; 330/264; 330/267
[58] Field of Search ..... 330/51, 277, 264 (U.S. only), 330/288 (U.S. only), 267 (U.S. only), 296 (U.S. only); 328/127 (U.S. only); 307/500 (U.S. only), 501 (U.S. only), 517 (U.S. only), 520 (U.S. only), 521 (U.S. only)

[56] References Cited

U.S. PATENT DOCUMENTS 4,352,073  9/1982  Leuthold .................. 330/264

*Primary Examiner*—James B. Mullins
*Assistant Examiner*—Steven J. Mottola
*Attorney, Agent, or Firm*—Parkhurst & Oliff

[57] ABSTRACT

A dynamic amplifier comprises two complementary MOS transistors T1 and T2 which are connected in series, the gates G1 and G2 of which are connected to each other and to an input node by way of capacitors C1 and C2. The gate of T1 is connected to its drain by a switch means S1. The input node is connected to an input terminal and a reference voltage terminal by switch means S4 and S3 respectively and an output node between T1 and T2 is connected to an output terminal by switch means S5. The gate of T2 is connected by way of a switch means S2 to a bias voltage source. The switch means S1 to S5 are actuated in such a way that in a first, preparation phase of the amplifier, switches S1, S2 and S3 are closed with the input node being at a reference voltage Vref and the currents I1 and I2 through T1 and T2 being equal to a value fixed by the voltage source and, in an amplification phase, switches S4 and S5 are closed so that the output current Is increases in absolute value with the voltage Ve applied to the input node.

8 Claims, 8 Drawing Figures

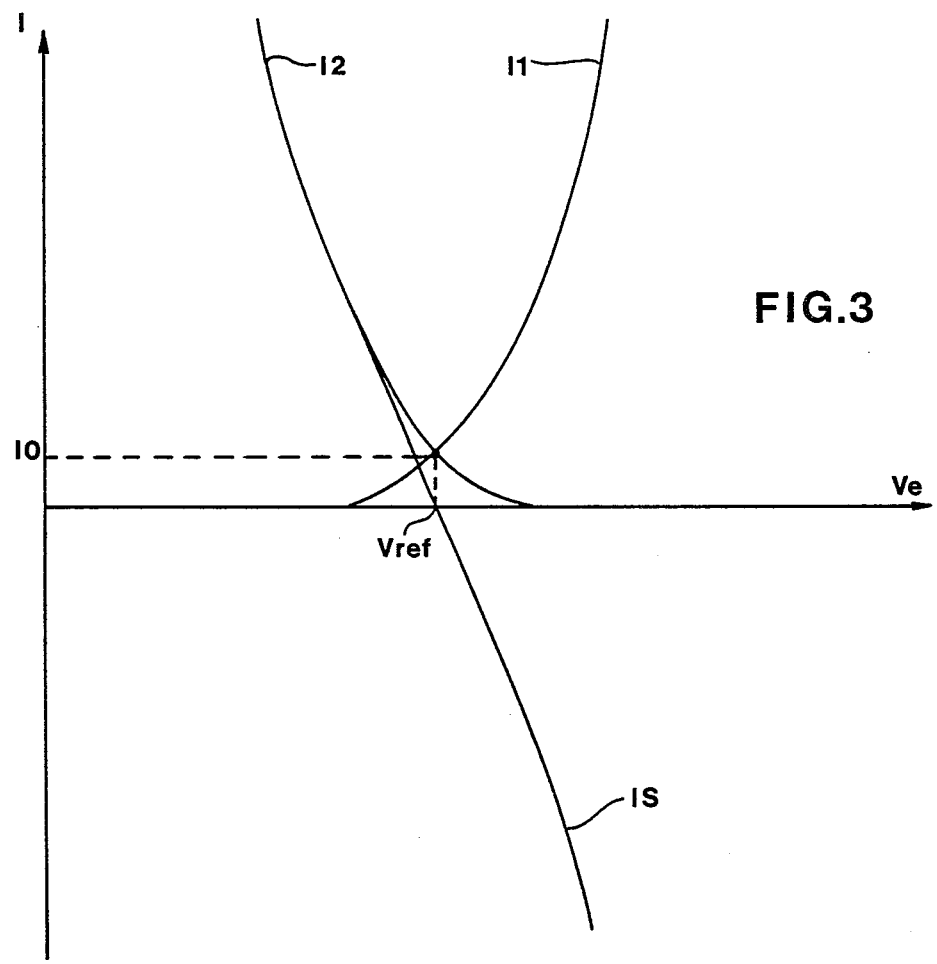
FIG.3
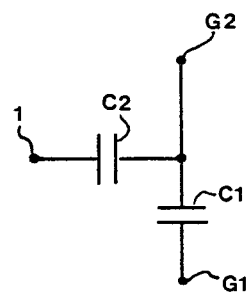
FIG.4.a
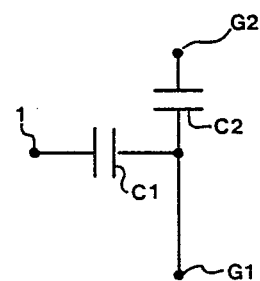
FIG.4.b

CMOS DYNAMIC AMPLIFIER

The present invention concerns a low-consumption amplifier which is of the complementary MOS (CMOS) type, and relates more particularly to a dynamic amplifier which is intended to serve as a base cell in switched-capacitor circuits.

Operational amplifiers can be used to perform a large number of analog functions. In MOS circuit design, they are necessary in particular for making integrators which are used in switched-capacitor filters. An important characteristic of the amplifier is its d.c. voltage gain which must be as high as possible (typically, higher than 10,000). Another very important characteristic is the transconductance of the amplifier, namely: $gm = -(\partial Is/\partial Ue)$, in which Is represents the output current of the amplifier and Ue represents its input voltage. The current consumed by the amplifier increases in proportion to increased transconductance gm. The article entitled 'High voltage gain CMOS OTA for micropower SC filters' which appeared in Electronics Letters, Vol. 17, No. 4 of Feb. 19, 1981 describes a CMOS amplifier with a very low level of current consumption. However, with such an amplifier, the speed of reaction in regard to large variations in the input voltage is still limited by the maximum output current Is available for charging or discharging the load capacitor at the output of the amplifier. In fact, the maximum output current may not exceed the bias current. This limitation which is due to the slope of the output signal (referred to as the 'slew rate') can be overcome by using a dynamic amplifier which is biased by the signal and the current consumption of which rises with the amplitude of the input signal. A dynamic amplifier of this kind is described in the article by Bedrich J. Hosticka, entitled 'Dynamic CMOS amplifier', which appeared in the U.S. Journal IEEE JSSC, Vol. SC 15, No. 5, of October 1980. However, such an amplifier, which is illustrated more particularly in FIG. 8 of the Hosticka article, does not make it possible to have a value in respect of the transconductance gm, which is sufficient for small signals, and this greatly delays the end of the stabilization process (return to the equilibrium condition).

Thus, one object of the present invention is the provision of a dynamic amplifier of CMOS type, which does not suffer from the above-mentioned disadvantages.

Another object of the present invention is the provision of an integrator circuit using the above-mentioned amplifier.

Other objects and the features and advantages of the present invention will be more clearly apparent from the following description of particular exemplary embodiments, which is provided with reference to the accompanying drawings in which:

FIG. 3 shows the curves representing the variations in output currents in dependence on the input voltage of the circuit shown in FIG. 1;

FIGS. 4a and 4b show capacitive coupling configurations equivalent to that shown in FIG. 1;

Figure 1:
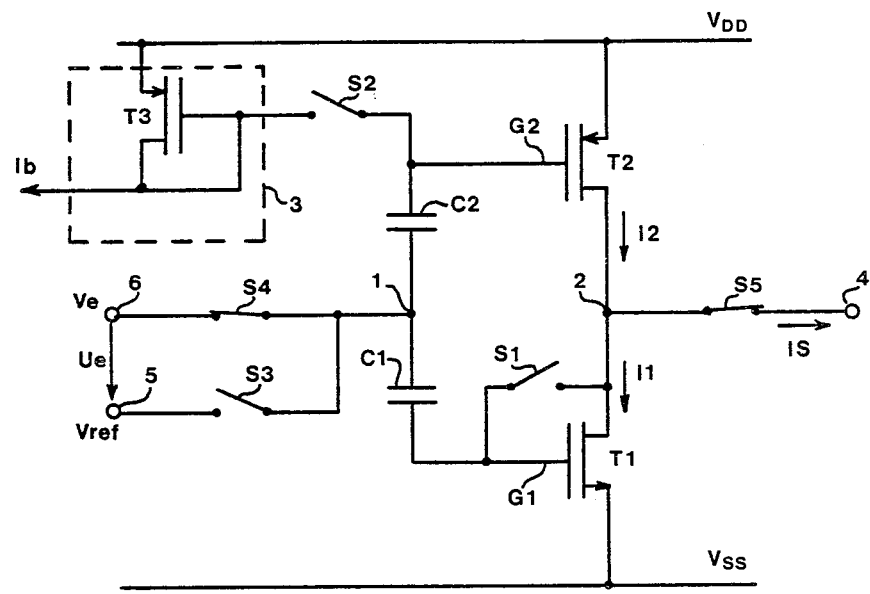
FIG. 1 shows a dynamic amplifier according to the invention.

The circuit shown in FIG. 1 represents a dynamic amplifier of CMOS type, in accordance with the principles of the present invention. It comprises at least one pair of complementary MOS transistors, i.e. T1 (of n-channel type) and T2 (of p-channel type), which are connected in series between the positive terminal VDD and the negative terminal Vss of a power supply source. The gates G1 and G2 of the transistors T1 and T2 are connected together capacitively by means of capacitors C1 and C2. A switch means S1 is connected between the gate G1 and the drain of the transistor T1. A second switch means S2 is provided for periodically connecting the gate G2 of the transistor T2 to a voltage source 3. The voltage source 3 is formed by means of a p-channel transistor T3, the source of which is connected to the positive supply terminal VDD, while the gate, which is connected to the drain of the transistor T3 and to a current source supplying a current Ib, forms the output terminal of the voltage source 3. The input node 1 which is the point common to the two capacitors C1 and C2 is connected to a reference terminal 5 (Vref) by way of a third switch means S3 and to an input terminal 6 (Ve) by way of a fourth switch means S4. The output node 2 which is common to the drains of the transistors T1 and T2 is connected to an output terminal 4 by way of a fifth switch means S5. Although they are represented by switch symbols, the switch means S1 to S5 are actually formed by n-channel transistors, p-channel transistors or pairs of complementary transistors.

Figure 2:
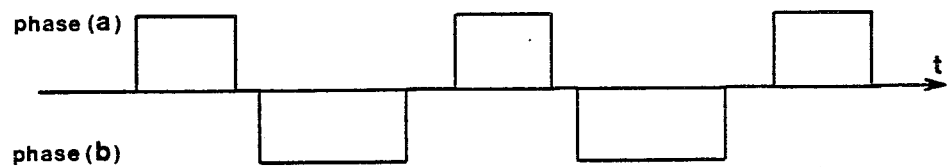
FIG. 2 shows the switching phases of the switch means of the circuit shown in FIG. 1.

The circuit shown in FIG. 1 operates in two alternate phases referred to as phase (a) and phase (b). During phase (a) or the preparation phase, the switch means S1, S2 and S3 are closed while the switch means S4 and S5 are open. During phase (b) or the amplification phase, the switch means S4 and S5 are then closed while the switch means S1 to S3 are open. FIG. 2 shows the distribution in respect to time of the phases (a) and (b). FIG. 2 also shows that each phase is separated from the following phase by an interval of time, during which all the switch means are open.

The mode of operation of the circuit of the invention will now be described with reference to FIGS. 1 to 3. During the preparation phase (a), the switch means S1, S2 and S3 are closed and the switch means S4 and S5 are open. The transistors T2 and T3 form a current mirror such that, in the equilibrium condition, the drain currents I1 and I2 of the transistors T1 and T2 respectively assume the value I0 defined by the relationship:

$$I0 = Ib \cdot \frac{W2}{L2} \cdot \frac{L3}{W3}$$

In the above relationship, Ib is the drain current of the transistor T3, W2 and L2 are respectively the effective width and length of the channel of the transistor T2, and W3 and L3 are the effective width and length of the channel of the transistor T3. The current value I0 determines the point of intersection of the curves in FIG. 3 which shows the variation in the current I1 and the current I2 in dependence on the voltage Ve applied to the input terminal 6.

When the circuit goes into the amplification phase (b), with the output terminal 4 being connected to a capacitive load CL, the switch means S1, S2 and S3 are then open while the switch means S4 and S5 are closed. The voltages across C1 and C2 remain constant and equal to the values attained at the end of the preparation phase (a). The difference between the voltages applied to the terminals 5 and 6, namely $Ue=Ve-Vref$, is therefore transmitted in its entirety to the gates G1 and G2 of the transistors T1 and T2 respectively. The variation in the gate voltages causes a variation in the current I1 and I2, in accordance with the curves shown in FIG. 3. If the voltage difference Ue is positive, the current I1 will be higher than the value I0 while the current I2 will be lower than the value I0. If, on the other hand, the voltage difference Ue is negative, the current I1 will be lower than the value I0 while the current I2 will be higher. The output current Is which is equal to I2−I1 may greatly exceed the bias current I0. Far from the equilibrium position, the transconductance $gm=-(\partial Is/\partial Ve)$ is equal, except for the sign, to the slope of the characteristic I1 (or I2) in dependence on Ve. Around the equilibrium position, that is to say when Ue≃0, the transconductance gm is equal to the sum of the slopes of the characteristics of I1 in dependence of Ve and I2 in dependence on Ve when I1=I2=I0. As the current I0 is closely controlled, the value of the transconductance in the equilibrium condition is also closely defined.

FIGS. 4a and 4d show two configurations in respect of capacitive coupling between the gates G1 and G2 and the input node 1, which are equivalent to that shown in FIG. 1. In FIG. 4a, the gate G1 is connected to the gate G2 by way of the capacitor C1 and to the input node 1 by way of the capacitors C1 and C2 in series, while the gate G2 is connected to the point which is common to the two capacitors C1 and C2.

In FIG. 4b, the gate G2 is connected to the gate G1 by way of the capacitor C2 and to the node 1 by way of the capacitors C2 and C1 in series, while the gate G1 is connected to the point which is common to the two capacitors C1 and C2.

Figure 5:
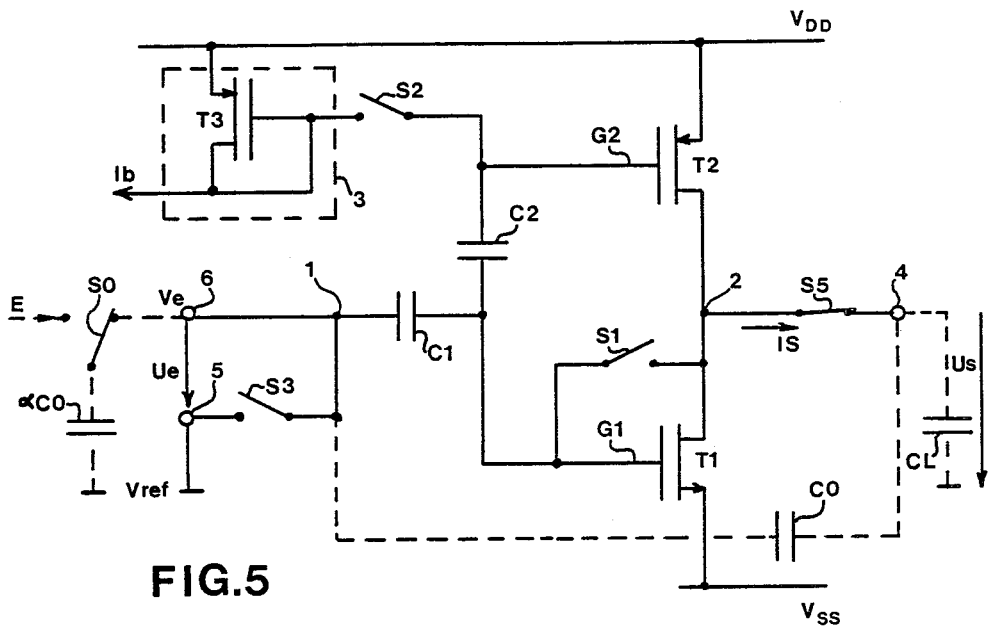
FIG. 5 shows an integrator circuit using the amplifier according to the invention.

FIG. 5 shows an integrator circuit which is known in respect of its general design but which uses the amplifier according to the invention, with the circuit configuration shown in FIG. 4b. The common components are denoted by the same references. The components which are provided to constitute the integrator are shown in broken lines. Those components are: an integration capacitor C0 connected between the output terminal 4 and the input node 1; an input capacitor αC0 which, with the change-over switching means S0, forms a known equivalent for the input resistance of the conventional arrangements; and a load which is diagrammatically indicated by a capacitor CL connected between the output terminal 4 and the reference terminal 5.

In the arrangement shown in FIG. 5, the switch means S4 in FIG. 1 is combined with the changeover switching means S0 which causes the capacitor αC0 to be charged by the input signal E in phase (a) while in phase (b) it connects the capacitor which is charged in that manner, to the input terminal 6. It has been seen hereinbefore that the output current Is could assume a value which is much greater than the bias current I0. Thus, if the input voltage Ue undergoes a large variation, the substantial current Is which results therefrom rapidly charges or discharges the load CL. The corresponding variation in Us is transmitted to the input terminal by the capacitor C0, which causes Ue quickly to return towards zero. When Ue is low, the return to the equilibrium condition is completed with a time constant which is proportional to (1/gm), wherein gm is the above-defined transconductance.

Figure 6:
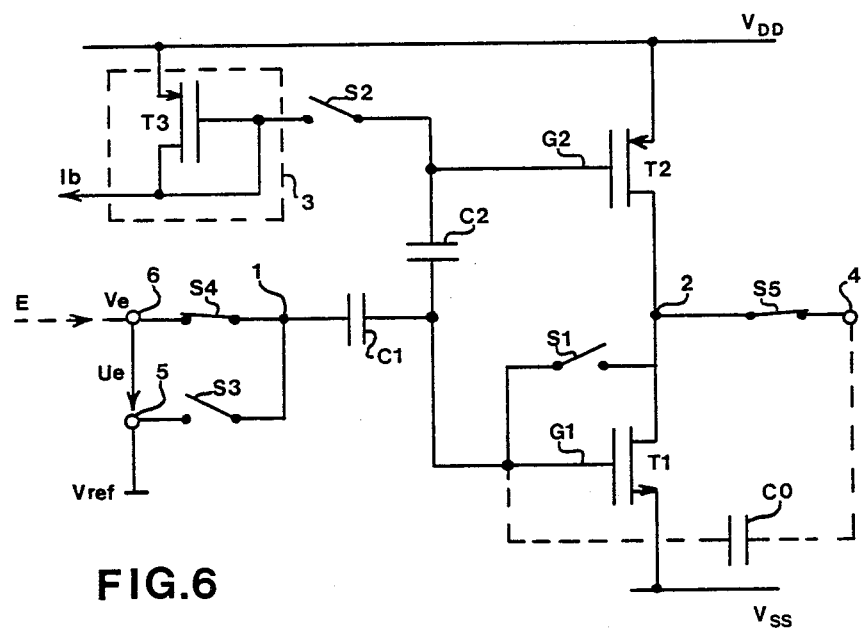
FIG. 6 shows another integrator circuit using the amplifier of the invention.

FIG. 6 shows a particularly advantageous embodiment of the integrator circuit using the amplifier according to the invention, with the configuration shown in FIG. 4b. In this embodiment, the integration capacitor C0 is connected between the output terminal 4 and the gate of the transistor T1. The capacitor C1 acts both as a coupling capacitor and as an input capacitor, forming, with the switch means S3 and S4, the equivalent of an input resistor in the conventional circuit designs. In comparison with the embodiment shown in FIG. 5, the FIG. 6 embodiment has the advantage of adding only one additional capacitor to the amplifier shown in FIG. 1, to provide an integrator circuit and in particular to provide an integrator circuit which is insensitive to parasitic capacitances, more particularly of the switch means S3 and S0 (in the circuit shown in FIG. 5).

Figure 7:
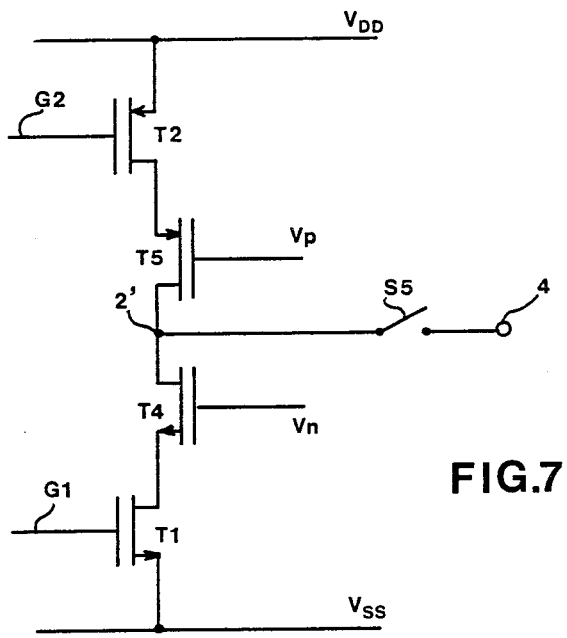
FIG. 7 shows an alternative form of the circuit shown in FIG. 1.

FIG. 7 shows another embodiment of the circuit of the invention, wherein the continuous gain of the amplifier is increased by a cascode-type arrangement. In this embodiment, two supplementary transistors T4 and T5 are connected in series between the drains of the transistors T1 and T2. The output node 2' which is connected to the output terminal 4 by way of the switch means S5 is formed by the point which is common to the drains of the transistors T4 and T5. The transistor T4 is of n-channel type while the transistor T5 is of p-channel type. The gate voltages Vn and Vp of the transistors T4 and T5 respectively must be sufficient to cause saturation of the transistors T1 and T2. They can be obtained from an arrangement as described in the above-mentioned article from Electronics Letters, in particular in FIG. 1 thereof.

Although the present invention has been described within the framework of particular embodiments by way of example, it will be clearly appreciated that the invention is in no way limited to those examples and that it may be the subject of other variations or modifications without thereby departing from the scope thereof.

What is claimed is:

1. A low-consumption C-MOS amplifier comprising: first and second transistors of complementary types, and having a gate, a source and a drain, said first and second transistors being drain coupled and connected in series between the terminals of a power supply source and having their respective gates capacitively coupled both to each other and to a common input node, a first switch means connected between the gate and the drain of the first transistor, a second switch means connected between the gate of the second transistor and a bias voltage source, a third switch means connected between the input node and a terminal which is at a reference potential, a fourth switch means connected between the input node and an input terminal receiving an input signal, a fifth switch means connected between a point which is between the drains of the first and second transistors and an output terminal, and means for causing periodic closure of the first, second and third switch means in a first, preparation phase of said amplifier, and periodic closure of the fourth and fifth switch means in a second, amplification phase of said amplifier.

2. An amplifier according to claim 1, wherein the bias voltage source comprises a third transistor of the same type as the second transistor, said third transistor having a gate, a source and a drain, the source of the third transistor being connected to the source of the second transistor and the gate of the third transistor being connected to the drain of said third transistor and to a current source, the gate of the third transistor forming the output terminal of the bias voltage source.

3. An amplifier according to claims 1 or 2, further comprising a fourth transistor of the same type as the first transistor and a fifth transistor of the same type as the second transistor, each of said fourth and fifth transistors having a gate, a source and a drain, said fourth and fifth transistors being connected drain to drain in series between the first and second transistors, the point which is common to the drains of the fourth and fifth transistors being the point connected to the output terminal by way of the fifth switch means, and means for biasing the gates of the fourth and fifth transistors with voltages sufficient to cause saturation of the first and second transistors.

4. An amplifier according to any one of claims 1 or 2, wherein said capacitor coupling comprises a first capacitor coupling the gate of the first transistor to the gate of the second transistor and a second capacitor coupling the gate of the first transistor to the input node, and wherein an integration capacitor is connected between the output terminal and the gate of the first transistor, whereby said amplifier forms an integrator circuit.

5. An amplifier according to claim 3, wherein said capacitor coupling comprises a first capacitor coupling the gate of the first transistor to the gate of the second transistor and a second capacitor coupling the gate of the first transistor to the input node, and wherein an integration capacitor is connected between the output terminal and the gate of the first transistor, whereby said amplifier forms an integrator circuit.

6. An amplifier as in claims 1 or 2, wherein said capacitor coupling comprises a first capacitor coupling the gate of the first transistor to the gate of the second transistor and a second capacitor coupling the gate of the first transistor to the input node.

7. An amplifier as in claims 1 or 2, wherein said capacitor coupling comprises a first capacitor coupling the gate of the first transistor to said input node and a second capacitor coupling the gate of the second transistor to said input node.

8. An amplifier as in claims 1 or 2, wherein said capacitor coupling comprises a first capacitor coupling the gate of the first transistor to the gate of the second transistor and a second capacitor coupling the gate of the second transistor to the input node.

* * * * *